United States Patent
Cloutier et al.

(10) Patent No.: US 9,172,381 B2
(45) Date of Patent: Oct. 27, 2015

(54) FAST TURN ON SYSTEM FOR A SYNTHESIZED SOURCE SIGNAL

(71) Applicant: Hittite Microwave Corporation, Chelmsford, MA (US)

(72) Inventors: Mark M. Cloutier, Gatineau (CA); Greg Bachmanek, Ottawa (CA); Tolga Pamir, Ottawa (CA)

(73) Assignee: Hittite Microwave Corporation, Chelmsford, MA (US)

( * ) Notice: Subject to any disclaimer, the term of this patent is extended or adjusted under 35 U.S.C. 154(b) by 232 days.

(21) Appl. No.: 13/833,324

(22) Filed: Mar. 15, 2013

(65) Prior Publication Data

US 2014/0269665 A1    Sep. 18, 2014

(51) Int. Cl.
   *H04J 3/06* (2006.01)
   *H03L 7/00* (2006.01)
   *H03F 3/00* (2006.01)

(52) U.S. Cl.
   CPC ... *H03L 7/00* (2013.01); *H03F 3/00* (2013.01)

(58) Field of Classification Search
   None
   See application file for complete search history.

(56) References Cited

U.S. PATENT DOCUMENTS

| | | | |
|---|---|---|---|
| 4,634,998 A | 1/1987 | Crawford | |
| 4,904,962 A | 2/1990 | Greene | |
| 5,438,703 A | 8/1995 | Ng et al. | |
| 5,900,785 A | 5/1999 | Freed | |
| 6,766,154 B2 | 7/2004 | Humes et al. | |
| 7,129,791 B2 | 10/2006 | Hofmann | |
| 8,004,324 B2 | 8/2011 | Tajima et al. | |
| 8,044,734 B2 | 10/2011 | Lane | |
| 2007/0015481 A1* | 1/2007 | Hirose et al. | 455/313 |
| 2011/0241771 A1 | 10/2011 | Nielson et al. | |
| 2013/0069721 A1* | 3/2013 | Lin | 330/253 |
| 2013/0161805 A1* | 6/2013 | Fishley et al. | 257/676 |

FOREIGN PATENT DOCUMENTS

EP     590 706 A1     4/1994
WO     WO 2010/117466 A1     10/2010

OTHER PUBLICATIONS

Inernational Search Report and Written Opinion of Jul. 21, 2014 for International Application No. PCT/US14/24494, filed Mar. 12, 2014. 9 pages.

* cited by examiner

*Primary Examiner* — Jae Y Lee
*Assistant Examiner* — Alan Lindenbaum
(74) *Attorney, Agent, or Firm* — Knobbe, Martens Olson & Bear LLP (57) ABSTRACT

A fast turn on compensation system for a synthesized signal source includes a synthesized signal source coupled to a power supply and configured to generate a phase stable radio frequency (RF) output signal. A mute amplifier is coupled to the synthesized signal source and the power supply. A dummy amplifier is coupled to the mute amplifier and the power supply. A mute controller is coupled to the mute amplifier and the dummy amplifier, the mute controller is responsive to an enable signal and configured to enable the dummy amplifier and disable the mute amplifier when no RF output signal is being generated and disable the dummy amplifier and enable the mute amplifier when the RF output signal is being generated such that total power supply current delivered to the synthesized signal source and the dummy amplifier or mute amplifier is approximately constant before, during, and after enabling the mute amplifier to reduce phase disturbance of the RF output signals.

25 Claims, 6 Drawing Sheets

FAST TURN ON SYSTEM FOR A SYNTHESIZED SOURCE SIGNAL

FIELD OF THE INVENTION

This invention relates to fast turn on compensation system for a synthesized signal source

BACKGROUND OF THE INVENTION

A synthesized signal source, e.g., a phase lock loop (PLL), a phase locked voltage controlled oscillator (VCO) or similar type device, is often coupled to an output buffer or mute amplifier. The output buffer or mute amplifier turns the RF (Radio Frequency) output signal from the synthesized signal source on and off, isolates the output from the input, and provides RF output power as required by systems attached to it.

It is often desirable to be able to quickly turn on or turn off the synthesized signal source output. This is often necessary for Time Division Multiple Access (TDMA) systems requiring blanking between communication intervals (packets), such as in the GSM system. It is often desirable to have a near zero phase disturbance at turn on, e.g., less than about 5° of phase variation on the output signal phase, e.g., within about 5 μsec after turn on.

When the mute amplifier is enabled, it draws current from the power supply which disturbs the locked voltage controlled oscillator (VCO) of the synthesized signal source. This causes a disturbance in the synthesized signal source phase, which may jump at the turn on instant and decay slowly back to some final phase.

Often the VCO and mute amplifier are located in close proximity to each other on an integrated circuit chip. Isolation of the VCO and mute amplifier is difficult in small integrated circuits or with large discrete VCOs. Additionally, high quality VCO's may have narrow loop bandwidths, which have long settling times if disturbed. Such a design may result in electromagnetic coupling of the RF field created by the VCO and the RF field created by the mute amplifier. Such RF field coupling may create a phase disturbance or "wobble" and often results in a transient phase that moves slowly to a new steady state phase, which is typically at a different phase from the phase before the enable, known as phase disturbance.

When the mute amplifier is enabled, its impedance changes. This changes the impedance seen by the VCO which also creates a phase disturbance.

Many attempts have been made at designing PLL loop filters of the synthesized signal source that widen dynamically to allow for fast settling, then when settled, the loop filter is modified a second time, in some way to narrow the loop bandwidth for the needed slow response time in steady state operation. See, e.g., U.S. Pat. Nos. 5,438,703, 5,900,785, 6,766,154, 7,129,791, and 8,044,734, all of which are incorporated by reference herein. However, such circuits suffer from the problem that when the loop bandwidth is changed from fast to slow, the final phase offset is altered and the result is a phase transient that causes a long undesired settling time.

SUMMARY OF THE INVENTION

In one aspect, a fast turn on compensation system for a synthesized signal source is featured. A synthesized signal source is coupled to a power supply and configured to generate a phase stable radio frequency (RF) output signal. A mute amplifier is coupled to the synthesized signal source and the power supply. A dummy amplifier input is coupled to the mute amplifier input and the power supply. A mute controller is coupled to the mute amplifier and the dummy amplifier. The mute controller is responsive to an enable signal and configured to enable the dummy amplifier and disable the mute amplifier when no RF output signal is being generated and disable the dummy amplifier and enable the mute amplifier when the RF output signal is being generated such that total power supply current delivered to the synthesized signal source and the enabled dummy amplifier or mute amplifier is approximately constant before, during, and after enabling the mute amplifier to reduce phase disturbance of the RF output signal.

In one embodiment, the mute amplifier and the dummy amplifier may each be configured to draw the same amount of power supply current from the power supply when enabled. The mute amplifier and the dummy amplifier may each be coupled to synthesized signal source. The combined impedance of the mute amplifier and the dummy amplifier presented to the synthesized signal source may be configured to be approximately constant before, during, and after enabling the mute amplifier. The mute amplifier may be differentially coupled to RF output signal load and a complementary output signal load to reduce electromagnetic coupling between the RF output signal and the synthesized signal source. The mute amplifier input may be coupled to synthesized signal source. The system may include a buffer amplifier coupled between the mute amplifier and the synthesized signal source configured such that the impedance presented to the synthesized signal source is approximately constant before, during, and after enabling the mute amplifier and the synthesized signal source is isolated from the mute amplifier to reduce the effects of change in input impedance of the mute amplifier at the synthesized signal source when the mute amplifier is enabled. The synthesized signal source, the mute amplifier, the dummy amplifier, and the mute controller may be located on an integrated circuit chip. The synthesized signal source may include a phase lock loop. The synthesized signal source may be coupled to and responsive to a reference signal generator.

In another aspect, a fast turn on compensation system for a synthesized signal source is featured. A synthesized signal source is coupled to a power supply and configured to generate a phase stable radio frequency (RF) output signal. A mute amplifier is coupled to the synthesized signal source and the power supply. A dummy amplifier is coupled to the mute amplifier and the power supply and located in close proximity to the mute amplifier. A mute controller is coupled to the mute amplifier and the dummy amplifier. The mute controller is responsive to an enable signal and configured to enable the dummy amplifier and disable the mute amplifier when no RF output signal is being generated and disable the dummy amplifier and enable the mute amplifier when the RF output signal is being generated such that total power supply current delivered to the synthesized signal source and the enabled dummy amplifier or mute amplifier and the combined impedance of the mute amplifier and dummy amplifier presented to the synthesized signal source is approximately constant before, during, and after enabling the mute amplifier to reduce phase disturbance of the RF output signal.

In one embodiment, the mute amplifier and the dummy amplifier may each be configured to draw the same amount of current from the power supply when enabled. The mute amplifier and the dummy amplifier may each be coupled to synthesized signal source. The mute amplifier may be differentially coupled to the RF output signal load and a complementary output signal load to reduce electromagnetic coupling between the RF output signal and the synthesized signal source. The mute amplifier input may be coupled to synthesized signal source. The system may include a buffer amplifier coupled between the mute amplifier and the synthesized signal source configured such that the impedance presented to the synthesized signal source is approximately constant before, during, and after enabling the mute amplifier and the synthesized signal source is isolated from the mute amplifier to reduce the effects of change in input impedance of the mute amplifier impedance at the synthesized signal source when the mute amplifier is enabled. The synthesized signal source, the mute amplifier, the dummy amplifier, and the mute controller may be located on an integrated circuit chip. The synthesized signal source may include a phase lock loop. The synthesized signal source may be coupled to and responsive to a reference signal generator.

In another aspect, a fast turn on compensation system for a synthesized signal source is featured. A synthesized signal source is coupled to a power supply and configured to generate a phase stable radio frequency (RF) output signal. A mute amplifier is coupled to the synthesized signal source and the power supply. A dummy amplifier is coupled to the mute amplifier and the power supply and located in close proximity to the mute amplifier. A mute controller is coupled to the mute amplifier and the dummy amplifier, the mute controller is responsive to an enable signal and configured to enable the dummy amplifier and disable the mute amplifier when no RF output signal is being generated and disable the dummy amplifier and enable the mute amplifier when the RF output signal is being generated such that total power supply current delivered to the synthesized signal source and the enabled dummy amplifier or mute amplifier and the combined impedance of the mute amplifier and the dummy amplifier presented to the synthesized signal source is approximately constant before, during, and after enabling the mute amplifier to reduce phase disturbance of the RF output signal. The mute amplifier is differentially coupled to the RF output signal load and a complementary output signal load to reduce electromagnetic coupling between the RF output signal and the synthesized signal source.

In one embodiment, the mute amplifier and the dummy amplifier may each be configured to draw the same amount of current from the power supply when enabled. The system may include a buffer amplifier coupled between the mute amplifier and the synthesized signal source configured such that the impedance presented to the synthesized signal source is approximately constant before, during, and after enabling the mute amplifier and the synthesized signal source is isolated from the mute amplifier to reduce the effects of change in input impedance of the mute amplifier at the synthesized signal source when the mute amplifier is enabled. The synthesized signal source, the mute amplifier, the dummy amplifier, and the mute controller may be located on an integrated circuit chip. The synthesized signal source may include a phase lock loop. The synthesized signal source may be coupled to and responsive to a reference signal generator.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1A:
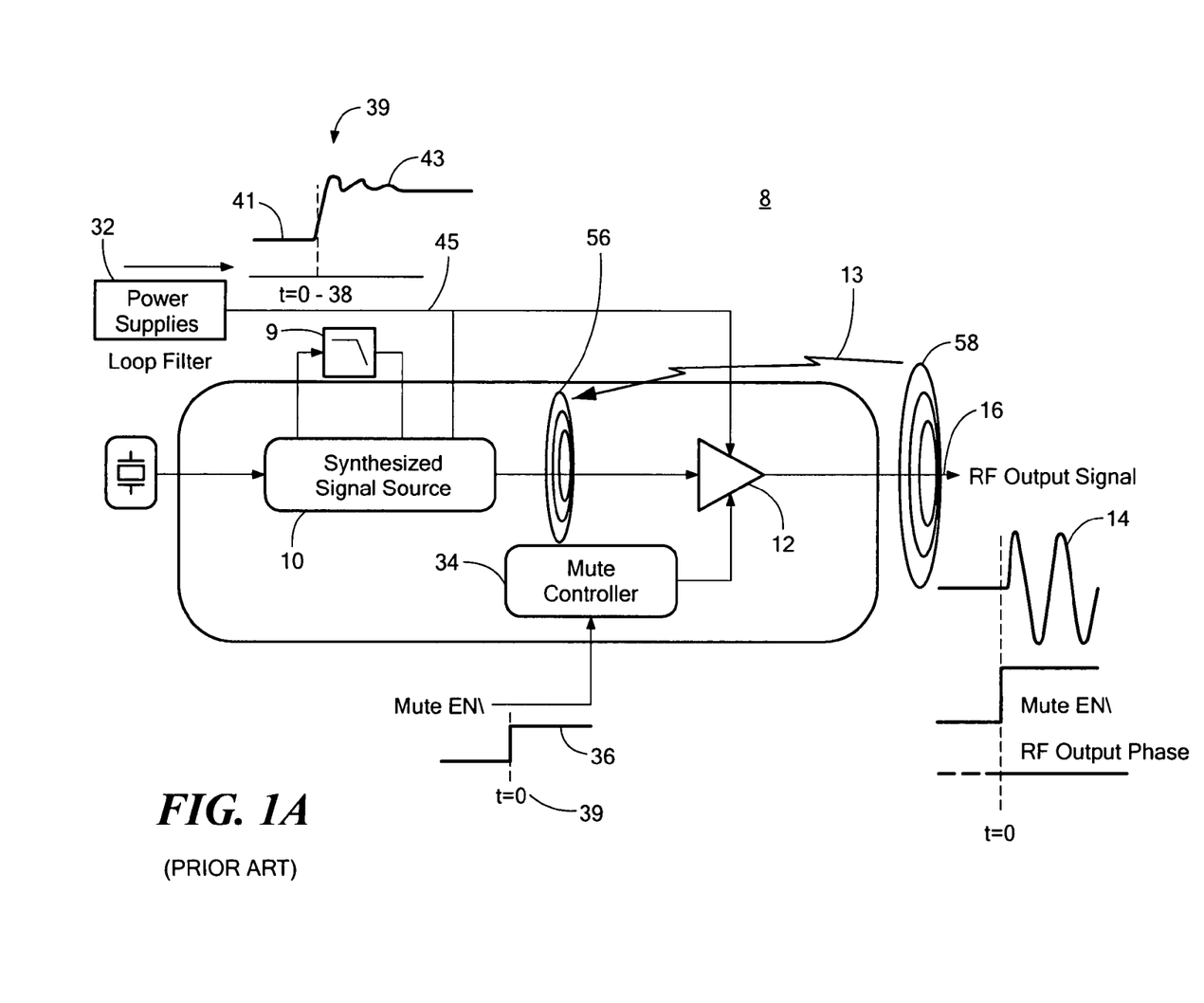
FIG. 1A is a schematic block diagram of a conventional synthesized source system used to generate a RF output signal.
Figure 1B:
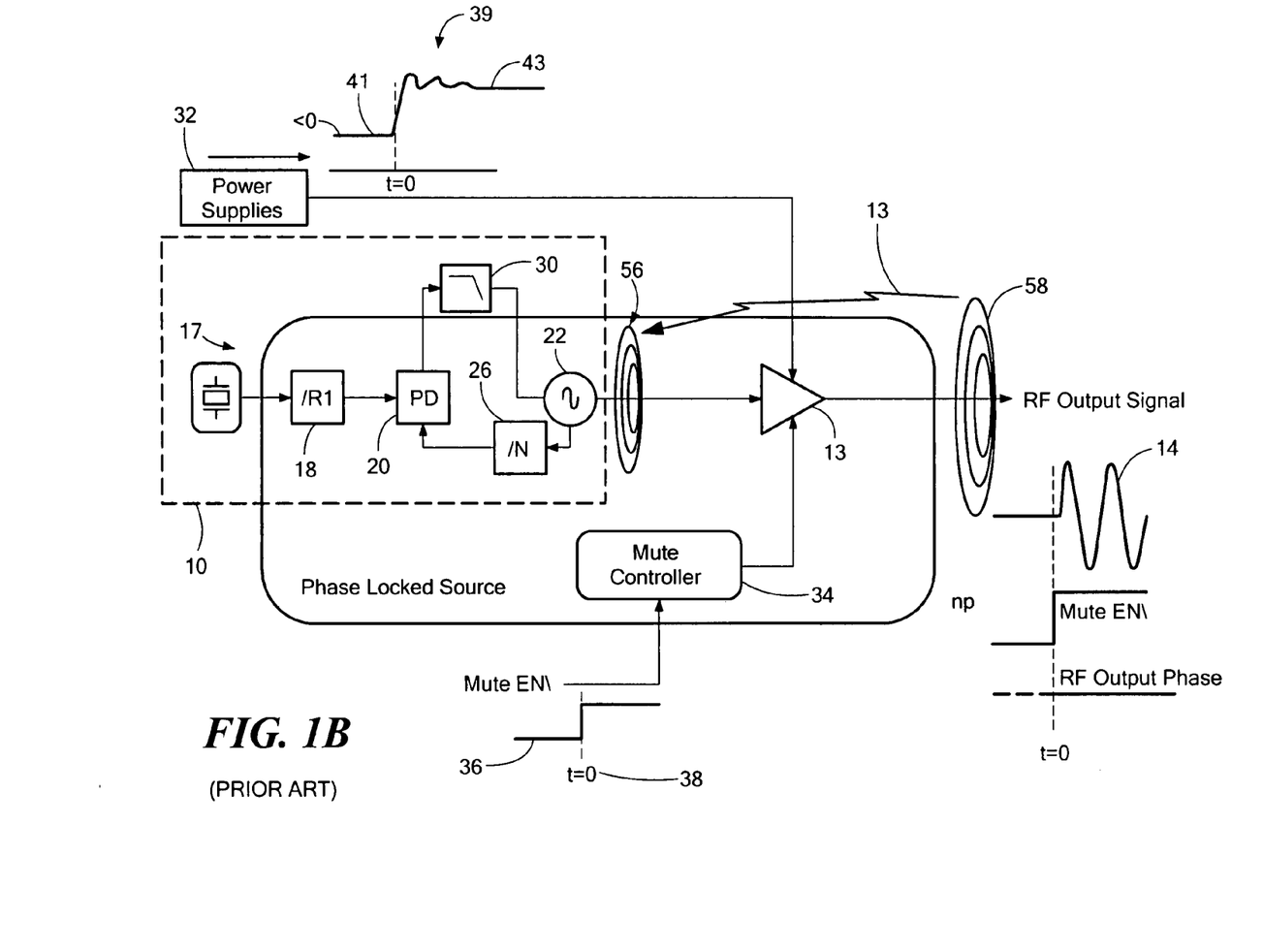
FIG. 1B is a schematic block diagram showing an example of the synthesized signal source shown in FIG. 1A configured as a phase locked lop (PLL)

Conventional synthesized source system 8, FIG. 1A, includes synthesized signal source 10 coupled to mute amplifier 12 configured to generate a phase stable RF output signal 14 on line 16. As disclosed herein, a synthesized signal source, such as synthesized source signal 10, may be as phase lock loop (PLL), phase locked VCO, or similar type device. FIG. 1B show one example of PLL 17 which, in this example, includes reference divider 18, phase detector 20, voltage controlled oscillator 22, feedback divider 26, and loop filter 30. As used herein, a mute amplifier turns the synthesized signal source on and off, isolates the output from the input, and provides RF output power as required by systems attached to synthesized signal source. Power supply 32, FIG. 1A, is coupled to synthesized signal source 10 and mute amplifier 12 as shown. Other configurations of power supply 32 are also possible, such as separate supplies or voltage levels to synthesized source 10 and mute amplifier 12.

In operation, synthesized signal source 10 is typically constantly running a sufficient amount of time prior to enabling RF output power so as not to affect output phase transients after the enable event. In order to generate RF output signal 14, mute amplifier 12 must be enabled. Mute controller 34 is responsive to enable signal 36. At time $t_0$-38, enable signal 36 turns on or enables mute amplifier 12. The ideal RF output signal 14 at the instant of enablement of mute amplifier 12 would be sinusoidal signal as shown at by RF output signal 14 having no phase distortion at all. The output phase need not necessarily be zero, but it preferably has a mean constant value which is fixed, and a variance which is less than some defined limit for all time within some defined time after start up.

However, when mute amplifier 12 is enabled at $t_0$-38, it draws power supply current from power supply 32 which disturbs synthesized signal source, e.g., VCO 22, FIG. 1B. Graph 39, in the upper left, shows the total supply current drawn by synthesized signal source 10 and mute amplifier 12 before mute amplifier 12 is enabled at $t_0$-38, indicated at 41, and the total power supply current drawn by synthesized signal source 10 after mute amplifier 12 is enabled, indicted at 43. As can be seen by graph 39, the total power supply current on line 45 before and after mute amplifier is enabled is not constant. This causes synthesized signal source 10, FIG. 1A, to experience a phase disturbance which deviates the phase immediately after the enable event and may also cause the phase to transient solely to a new steady state phase which is typically at a different phase from before enabling mute amplifier 12, a phenomenon known as phase disturbance.

Figure 2:
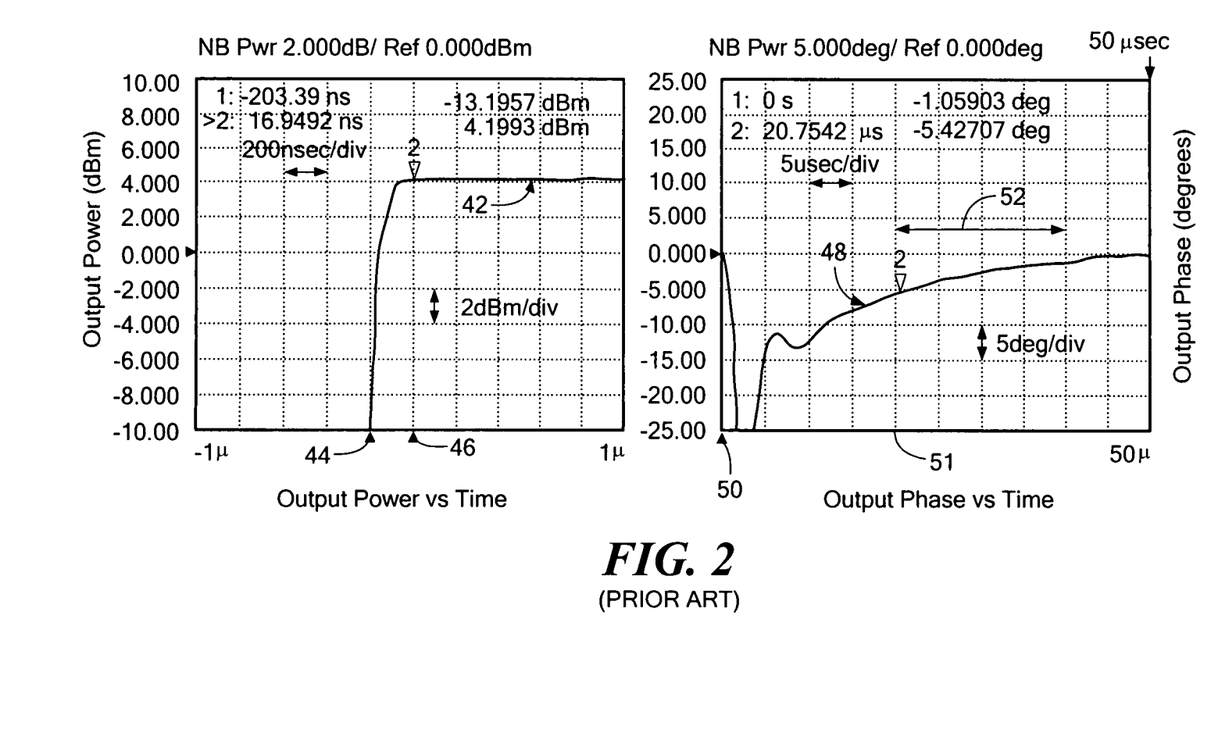
FIG. 2 are graphs depicting output RF power and phase of the conventional synthesized source system shown in FIGS. 1A-1B when output RF power is enabled.

FIG. 2 shows an example of an actual 2 GHz synthesized source 10 with real RF output characteristics measured on an integrated circuit chip. Graph 42 on the left shows the RF power of synthesized signal source 10 is effectively at a steady state at full power at about 200 nanoseconds after enable signal 36, FIG. 1 is applied, indicated at 44 and 46, FIG. 2, respectively. Plot 48 on the right shows the variation in the output phase is large at the incident of the enable, indicated at 50, and for about 20 microseconds thereafter indicated at 51, and does not settle within 5° of the final phase for about 20 microseconds, indicated at 52.

Enabling mute amplifier 12, FIGS. 1A and 1B, changes the load impedance seen by the synthesized signal source 10. Additionally, transients in power supply 32 when mute amplifier 12 is enabled and electromagnetic coupling 13 between RF field 56 generated by synthesized signal source and RF field 58 generated by mute amplifier 12 all cause the phase changes from the steady state prior to enabling mute amplifier 12. The combined effects lead to disturbances which cause synthesized signal source 10 to transient slowly to a new steady state phase.

Figure 3:
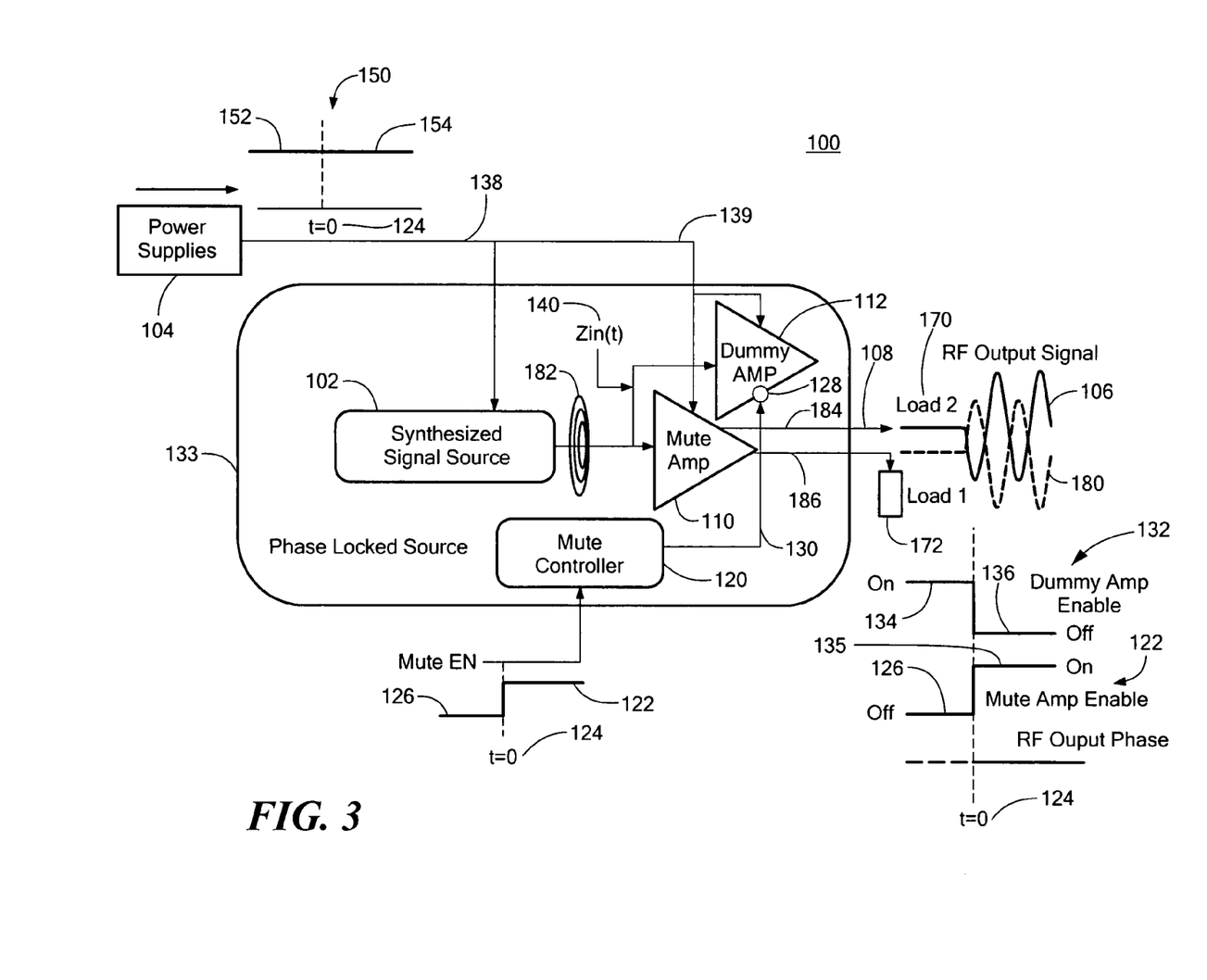
FIG. 3 is a schematic block diagram of one embodiment of the fast turn on compensation system for a synthesized signal source of this invention.

Fast turn on compensation system 100, FIG. 3, for a synthesized signal source of one embodiment of this invention includes synthesized signal source 102 coupled to at least one power supply 104. In one example, synthesized signal source 102 is configured as PLL, e.g., similar to PLL 17, FIG. 1B, a phase locked voltage controlled oscillator (VCO) or similar type device. Synthesized signal source 102, FIG. 3, is configured to generate phase stable radio frequency output signal 106 by line 108. System 100 also includes mute amplifier 110 coupled to synthesized signal source 102 and power supply 104 as shown. System 100 also includes dummy amplifier 112 coupled power supply 104 and, in this example, to synthesized signal source 102. Dummy amplifier 112 is typically in close proximity to mute amplifier 110 as shown, and draws current from the same power supply line 139. Dummy amplifier preferably 112 has approximately the same design characteristics as mute amplifier 110. Mute amplifier 110 and dummy amplifier 112 are preferably configured to draw approximately the same amount of current from power supply 104 when enabled and draws current from the same power supply line 139. Preferably, synthesized signal source 102, mute amplifier 110, dummy amplifier 112, and mute controller are located on integrated circuit chip 133.

System 100 also includes mute controller 120 coupled to mute amplifier 110 and dummy amplifier 112. Mute controller 120 is responsive to enable signal 122 and is configured to enable dummy amplifier 112 and disable mute amplifier 110 when no RF output signal 106 is being generated and disabled dummy amplifier 112 and enable mute amplifier 110 when the RF output signal 106 is being generated such that the total power supply current delivered by power supply 104 to the enabled mute amplifier 110 or dummy amplifier 112 and synthesized signal source 102 is approximately constant for a sufficient amount of time before, during, and after enabling mute amplifier 110 as is needed to reduce phase disturbance of RF output signals 106 on line 108.

Thus, fast turn on compensation system 100 includes dummy amplifier 112 that draws the same power supply current from power supply 104 as mute amplifier 110 but operates in a complimentary fashion. Mute controller 120 controls the dummy amplifier 112 in such a way as to have the dummy amplifier 112 drawing current prior to enabling mute amplifier 110 at time $t_0$-124 (the transient event) and mute amplifier 110 is turned off or disabled. When mute amplifier 110 is turned on or enabled, dummy amplifier 112 is turned off or disabled in such a way as to keep the total power supply current on line 138 approximately constant before, during, and after the transient event.

For example, before mute amplifier 110 is enabled at time $t_0$-124, enable signal 122 input to mute amplifier 110 is a logic low, indicted at 126. Inverter 128 inverts enable single 122 on line 130 to create dummy amplifier enable signal 132 which is a logic high before time $t_0$-124, indicated at 134. In the example shown, inverter 128 is internal and located in dummy amplifier 112. In other designs, inverter 128 may be externally located from dummy amplifier 112. Thus, before $t_0$-124, dummy amplifier 112 is enabled and mute amplifier 110 is disabled. At time $t_0$-124, enable signal 122 transitions to a logic high and mute amplifier enable transitions to a logic low, indicated at 135, 136, respectively. This rapidly disables dummy amplifier 112 and enables mute amplifier 110 to generates RF output signal 106. The transition of disabling dummy amplifier 112 and enabling mute amplifier 110 is preferably very fast, e.g., in a few nanoseconds or less. The result is the total power supply current drawn by the combination of the mute amplifier 110 and the dummy amplifier 112 and synthesized signal source 102 is nearly constant before, during, and after the transient event of enabling mute amplifier 110. Graph 150 (in the upper left) shows the total power supply current drawn by synthesized signal source 102, dummy amplifier 112, and mute amplifier 110 before $t_0$-124, indicated at 152, and after $t_0$-124, indicated at 154 is nearly constant. The result is a reduction of phase disturbance of RF output signal 106.

Dummy amplifier 112 does not need to be always enabled when synthesized signal source 102 is disabled. Dummy amplifier 112 need only be enabled sufficiently in advance of the transient event such that the dummy amplifier 112 is stable and does not affect the phase of synthesized signal source 102. If a timed dummy amplifier 112 turn-on is used to save power supply current consumption, then fast turn on compensation system 100 may utilize a timer to allow adjustment of the amount of time needed for dummy amplifier 112 to power up in advance of the enablement of synthesized signal source 102 to meet the particular transient specifications of the application, and similarly may be powered down sufficiently after the enable event. In such a case power up and down of the dummy amplifier 112 must be done with a controlled power supply transient, slowly enough as to not disturb the RF output phase by more than some allowable threshold.

Because only one of dummy amplifier 112 and mute amplifier 110 are enabled at any given time, the load impedance, Zin(t), indicated at 140, seen or presented to synthesized signal source 102 is approximately constant before, during, and after the transient event thereby reducing the phase disturbance of RF output signals 106. As can be seen, before $t_0$-124, Zin(t)-140 is sum of the impedance of enabled dummy amplifier 112 and disabled mute amplifier 110. At $t_0$-124, dummy amplifier 112 transitions to off and mute amplifier 110 transitions to on. Because mute amplifier 110 and dummy amplifier 112 are preferably identical, the load impedance Zin(t)-140 after the transient event is nearly the same as prior to the transient event. Preferably mute amplifier 110 and dummy amplifier 112 are fast symmetrical switching amplifiers which reduce the need for matching during the transition. What is important is that load impedance Zin(t)-140 is approximately identical before and after the transient event and that the transition event be fast relative to the time constants of synthesized signal source 102.

Mute amplifier 110 is preferably differentially coupled to bring the RF output signal off the integrated chip in a differential fashion. The RF output signal load 170 and a complementary output signal load 172 as shown to reduce RF coupling between the mute amplifier 110 and the synthesized signal source 102. Preferably, the RF output energy or field 180 generated by mute amplifier 110 does not couple back to RF output energy or field 182 created by synthesized signal source 102 with sufficient RF coupling to cause phase disturbance of radio frequency output signal 106 to exceed desired specifications. In most conventional systems, this may be a relatively easy specification to meet and does not present a large problem. However, if mute amplifier 110 is in close proximity to synthesized signal source 102, e.g., as shown, then isolation of mute amplifier 110 from synthesized signal source 102 may be difficult.

To provide the desired insulation, fast turn on compensation system 100 may utilize differential outputs 184, 186 of mute amplifier 110 to help achieve the needed isolation. Such a design eliminates the need for special shielding, which is generally not available on an integrated circuit chip 133. In one example, mute amplifier 110 is preferably differentially coupled to the RF output signal load 170 and a complementary output signal load 172 by differential outputs 184, 186 to reduce RF field coupling between the mute amplifier 110 and the synthesized signal source 102. Preferably, the complimentary differential signals on differential outputs 184, 186 are carried off integrated circuit chip 133 with outputs as symmetrical and opposite as possible. The complementary signal 180 on differential output 186 cancel the RF field associated with RF output signal 106 on differential output 184 thus reducing the disturbance of RF field 182 at synthesized signal source 102. Once the differential signals are carried off integrated circuit chip 133, e.g., by inductive bond wires, further isolation may not be necessary and one leg may be terminated at load 172. Only a single-ended output would used by the application. It is also possible that in some sensitive applications that the differential outputs need to be routed together away from chip 133 to minimize the electromagnetic coupling from this effect to a sufficient level. Ideally fast turn on compensation system 100 would simply use both the differential outputs for delivering differential RF power to the application load.

Figure 4:
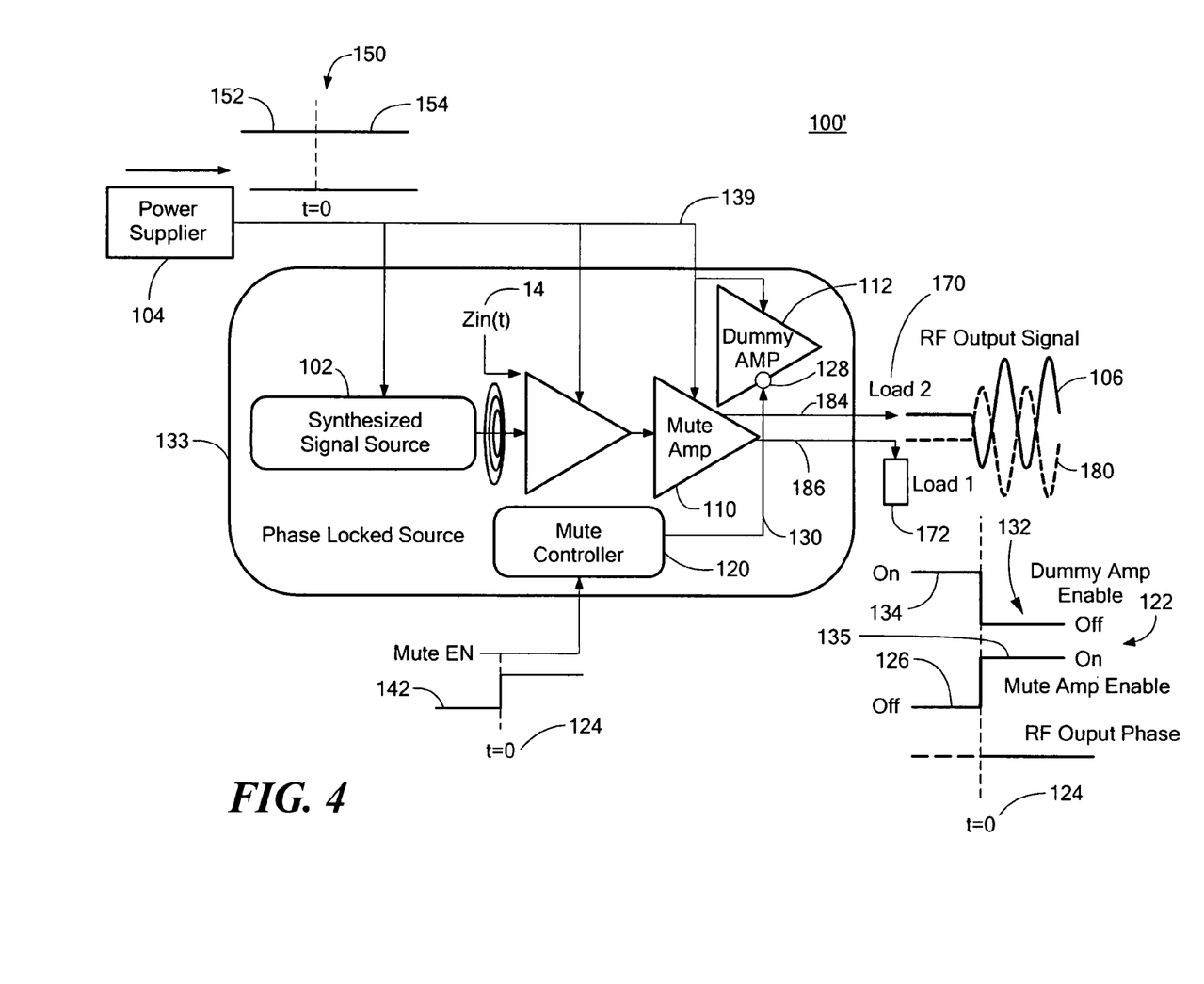
FIG. 4 is a schematic block diagram of another embodiment of the fast turn on compensation system for a synthesized signal source of this invention.

An alternative to having the dummy amplifier 112 load the RF path to the output is to use an additional buffering stage between the synthesized signal source 102 and mute amplifier 110 to effectively isolate the switching impedance of mute amplifier 110 from synthesized signal source 102. Fast turn on compensation system 100', FIG. 4, where like parts have been given like numbers, includes buffer amplifier 192 coupled between mute amplifier 110 and synthesized signal source 102. Buffer amplifier 102 is configured to isolate mute amplifier 110 from synthesized signal source 102 and configured such that the impedance presented to synthesized signal source 112 is approximately constant before, during, and after enabling mute amplifier 110.

The result is fast turn on compensation system 100 provides constant power supply current to the synthesized signal source 102 before, during, and after mute amplifier 110 is enabled. The switching combination of mute amplifier 110 and dummy amplifier 112 also presents a constant impedance to the synthesized source 102. Thus, system 100 reduces phase disturbance of RF output signal 106. System 100 also provides sufficient isolation of the RF output signals generated by mute amplifier 110 from synthesized signal source 102 to reduce RF field coupling of mute amplifier 110 and synthesized signal source 102 which reduces phase disturbance.

Figure 5:
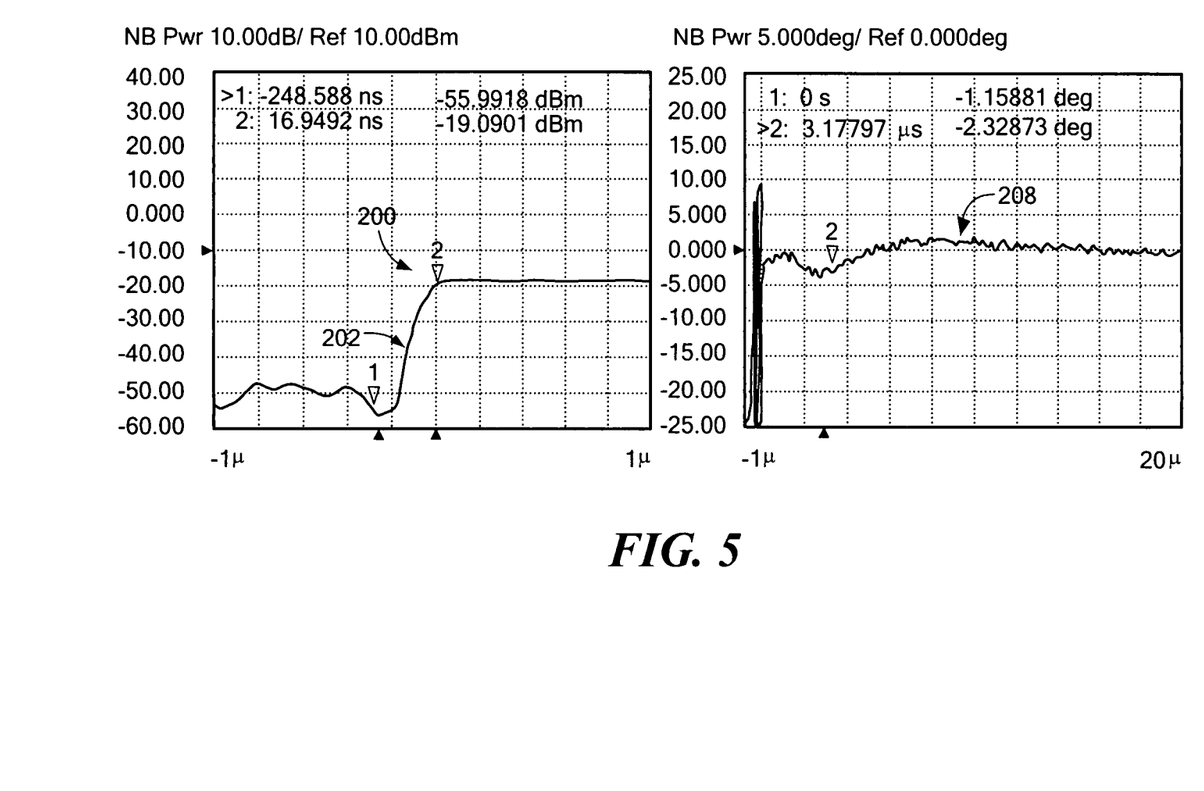
FIG. 5 depicts plots showing one example of the improved phase settling performance of one or more embodiments of the fast turn on compensation system shown in one or more of FIGS. 3-4.

FIG. 5 shows an example of the fast phase settling performance that can be achieved with one or more embodiment of fast turn on compensation system 100. Graph 200, on the left shows, the RF output signal power 106 transitioning at $t_0$-124, FIG. 3. In this example RF output signal 106 transitioning increases about 50 dB within about 200 nanoseconds of the transient event at $t_0$-123, indicated at 202, FIG. 6. As shown by plot 208 on the right, the output phase of RF output signal generated by fast turn on compensation system 100 of one more embodiments of this invention moves by only about plus or minus three degrees to reduce phase disturbance of RF output signal 106. The worse case disturbance at about 3 μsec after the transient event at $t_0$-124.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:

1. A fast turn on compensation system for a synthesized signal source comprising:
   a synthesized signal source coupled to a power supply and configured to generate a phase stable radio frequency (RF) output signal wherein transient signals on the power supply result in the synthesized signal source inducing transient signals on the phase stable radio frequency (RF) output signal;
   a mute amplifier coupled to the synthesized signal source and the power supply wherein the mute amplifier receives the phase stable radio frequency (RF) output signal and provides an amplified signal on an output;
   a dummy amplifier coupled to the mute amplifier and the power supply; and
   a mute controller coupled to the mute amplifier and the dummy amplifier, the mute controller responsive to an enable signal to enable the dummy amplifier and disable the mute amplifier when no RF output signal is being generated and disable the dummy amplifier and enable the mute amplifier when the RF output signal is being generated wherein the dummy amplifier power supply characteristics are selected to match the power supply characteristics of the mute amplifier such that the transient effect on the power supply signal seen by the synthesized signal source as a result of enablement or disablement of the mute amplifier is offset by the complementary disablement or enablement of the dummy amplifier.

2. The system of claim 1 in which the mute amplifier and the dummy amplifier are each configured to draw the same amount of power supply content from the power supply when enabled.

3. The system of claim 1 in which the mute amplifier and the dummy amplifier are each coupled to synthesized signal source.

4. The system of claim 3 wherein before, during, and after enabling the mute amplifier, the combined impedance of the mute amplifier and the dummy amplifier presented to the synthesized signal source is configured to reduce phase disturbances in the synthesized signal source.

5. The system of claim 1 in which the mute amplifier is differentially coupled to RF output signal load and a complementary output signal load to reduce electromagnetic coupling between the RF output signal and the synthesized signal source.

6. The system of claim 1 in which the mute amplifier is coupled to synthesized signal source.

7. The system of claim 6 further including a buffer amplifier coupled between the mute amplifier and the synthesized signal source configured to reduce variation of the impedance presented to the synthesized signal source before, during, and after enabling the mute amplifier by isolating the mute amplifier from the synthesized signal source.

8. The system of claim 1 in which the synthesized signal source, the mute amplifier, the dummy amplifier, and the mute controller are located on an integrated circuit chip.

9. The system of claim 1 in which the synthesized signal source includes a phase lock loop.

10. The system of claim 1 in which the synthesized signal source is coupled to and responsive to a reference signal generator.

11. A fast turn on compensation system for a synthesized signal source comprising:
a synthesized signal source coupled to a power supply and configured to generate a phase stable radio frequency (RF) output signal wherein transient signals on the power supply and transient impedance seen by the synthesized signal source result in the synthesized signal source inducing transient signals on the phase stable radio frequency (RF) output signal;
a mute amplifier coupled to the synthesized signal source and the power supply wherein the mute amplifier receives the phase stable radio frequency (RF) output signal and provides an amplified signal on an output;
a dummy amplifier coupled to the mute amplifier and the power supply; and
a mute controller coupled to the mute amplifier and the dummy amplifier, the mute controller responsive to an enable signal to enable the dummy amplifier and disable the mute amplifier when no RF output signal is being generated and disable the dummy amplifier and enable the mute amplifier when the RF output signal is being generated wherein the dummy amplifier power supply characteristics and impedance presented to the synthesized signal source are selected to match the mute amplifier power supply characteristics and impedance presented to the synthesized signal source such that the transient effect on the power supply signal and on the impedance seen by the synthesized signal source as a result of enablement or disablement of the mute amplifier is offset by the complementary disablement or enablement of the dummy amplifier.

12. The system of claim 11 in which the mute amplifier and the dummy amplifier are each configured to draw the same amount of current from the power supply when enabled.

13. The system of claim 11 in which the mute amplifier and the dummy amplifier are each coupled to synthesized signal source.

14. The system of claim 11 in which the mute amplifier is differentially coupled to the RF output signal load and a complementary output signal load to reduce electromagnetic coupling between the RF output signal and the synthesized signal source.

15. The system of claim 11 in which the mute amplifier is coupled to synthesized signal source.

16. The system of claim 11 further including a buffer amplifier coupled between the mute amplifier and the synthesized signal source configured to reduce variation of the impedance presented to the synthesized signal source before, during, and after enabling the mute amplifier by isolating the mute amplifier from the synthesized signal source.

17. The system of claim 11 in which the synthesized signal source, the mute amplifier, the dummy amplifier, and the mute controller are located on an integrated circuit chip.

18. The system of claim 11 in which the synthesized signal source includes a phase lock loop.

19. The system of claim 11 in which the synthesized signal source is coupled to and responsive to a reference signal generator.

20. A fast turn on compensation system for a synthesized signal source comprising:
a synthesized signal source coupled to a power supply and configured to generate a phase stable radio frequency (RF) output signal wherein transient signals on the power supply and transient impedance seen by the synthesized signal source result in the synthesized signal source inducing transient signals on the phase stable radio frequency (RF) output signal;
a mute amplifier coupled to the synthesized signal source and the power supply wherein the mute amplifier receives the phase stable radio frequency (RF) output signal and provides an amplified signal on an output;
a dummy amplifier coupled to the mute amplifier and the power supply; and
a mute controller coupled to the mute amplifier and the dummy amplifier, the mute controller responsive to an enable signal to enable the dummy amplifier and disable the mute amplifier when no RF output signal is being generated and disable the dummy amplifier and enable the mute amplifier when the RF output signal is being generated wherein the dummy amplifier power supply characteristics and impedance presented to the synthesized signal source are selected to match the mute amplifier power supply characteristics and impedance presented to the synthesized signal source such that the transient effect on the power supply signal and on the impedance seen by the synthesized signal source as a result of enablement or disablement of the mute amplifier is offset by the complementary disablement or enablement of the dummy amplifier; and
the mute amplifier is differentially coupled to RF output signal load and a complementary output signal load to reduce electromagnetic coupling between the RF output signal and the synthesized signal source.

21. The system of claim 20 in which the mute amplifier and the dummy amplifier are each configured to draw the same amount of current from the power supply when enabled.

22. The system of claim 21 further including a buffer amplifier coupled between the mute amplifier and the synthesized signal source configured to reduce variation of the impedance presented to the synthesized signal source before, during, and after enabling the mute amplifier by isolating the mute amplifier from the synthesized signal source.

23. The system of claim 20 in which the synthesized signal source, the mute amplifier, the dummy amplifier, and the mute controller are located on an integrated circuit chip.

24. The system of claim 20 in which the synthesized signal source includes a phase lock loop.

25. The system of claim 20 in which the synthesized signal source is coupled to and responsive to a reference signal generator.

* * * * *

UNITED STATES PATENT AND TRADEMARK OFFICE
CERTIFICATE OF CORRECTION

PATENT NO.        : 9,172,381 B2  
APPLICATION NO.   : 13/833324  
DATED             : October 27, 2015  
INVENTOR(S)       : Mark M. Cloutier Page 1 of 1

It is certified that error appears in the above-identified patent and that said Letters Patent is hereby corrected as shown below:

Title page

In column 1 (first page, item 56) at line 11, Under Other Publications, change "Inernational" to --International--.

Specification

In column 4 at line 58, After "all time" insert --,--.

In column 6 at line 24, Change "generates" to --generate--.

In column 7 at line 42, Before "used" insert --be--.

In column 8 at line 18, Change "worse" to --worst--.

Claims

In column 9 at line 7, In Claim 2, change "content" to --current--.

Signed and Sealed this  
Twenty-fourth Day of May, 2016

Michelle K. Lee  
*Director of the United States Patent and Trademark Office*